United States Patent [19]

Bruckner

[11] 3,784,960

[45] Jan. 8, 1974

[54] CARRIER FOR INTEGRATED CIRCUIT PACKAGES

[75] Inventor: Richard Bruckner, West Chester, Pa.

[73] Assignee: Bunker Ramo Corporation, Oak Brook, Ill.

[22] Filed: May 1, 1972

[21] Appl. No.: 248,980

[52] U.S. Cl. ..... 339/91 R, 339/17 CF, 339/176 MP

[51] Int. Cl. .......... H01r 13/54

[58] Field of Search .......... 339/17, 75, 91, 176

[56] References Cited

UNITED STATES PATENTS

| | | | |
|---|---|---|---|
| 3,700,788 | 10/1972 | Spurck | 339/17 CF |
| 3,671,921 | 6/1972 | Baker et al. | 339/91 R |
| 3,241,094 | 3/1966 | Harton | 339/91 R |
| 3,377,514 | 4/1968 | Ruehlemann et al. | 339/17 CF |

*Primary Examiner*—Joseph H. McGlynn
*Attorney*—Frederick M. Arbuckle

[57] ABSTRACT

A carrier for dual-in-line integrated circuit package having a rigid flat body is provided with retention means including an opposite pair of cantilever fingers integrally formed in opposite walls of the carrier and rearwardly extending therefrom in elongated form and at an acute angle with body-engaging surfaces provided with a plurality of rearwardly spaced-apart detents to accommodate bodies of differing thicknesses. The cantilever fingers are adapted to be deflected toward the walls by insertion of the body with at least one of the detents engaging a side of the body in a finger-force releasing relationship. The carrier also is provided with guide shoulders and rearwardly positioned support shoulders for predetermined positioning of the packages.

5 Claims, 6 Drawing Figures

CARRIER FOR INTEGRATED CIRCUIT PACKAGES

BACKGROUND OF THE INVENTION

Mainly because of their size, integrated circuits require special handling techniques. Directly related to the handling techniques is the necessity for providing carriers for the integrated circuit packages. These carriers provide means by which the integrated circuit packages can be handled and manipulated for marking, testing, including environmental testing, final packaging, user testing, and application of the package to circuit boards or the like. These carriers have a dual function. Their first function is to retain the integrated circuit. Their second function, which is related to the first function, is to retain the integrated circuit in a manner that permits them to be operated on by testing apparatus or the like as well as to provide means for manipulating them during the handling steps.

Prior art carriers for integrated circuit packages have utilized various retention techniques which in a number of instances have been dependent on the particular type of package being retained. In U.S. Pat. No. 3,529,277 entitled "Integrated Circuit Carrier", which is representative of carriers for dual-in-line integrated circuit packages, the package includes fourteen dual-in-line leads which, when inserted in the carrier, utilize their resistant spring pressure to press against opposite walls of the carrier for retention of the package. This type of retention generally is satisfactory when the leads are formed and arranged to provide a substantial degree of spring pressure against the carrier which also permits the desired release of the package by finger force applied against the rear side or non-lead side of the package in a frontward direction.

However, problems can occur when the dual-in-line packages are constructed with leads in which spring pressure has been minimized by location of the leads, heat treatment of the leads or the like. For example, in a more recent type of dual-in-line package, the leads are brazed to a ceramic body at elevated temperatures, resulting in leads with little appreciable spring properties. The lack of such properties often makes it difficult to retain this package by its leads in a conventional manner.

Accordingly, it is desirable to develop carriers which can retain dual-in-line integrated circuit packages without substantial dependence on spring pressure of the projecting leads and in a manner that permits the packages to operated on by testing apparatus or the like as well as to provide means for manipulating them during the handling steps. It is also desirable to develop carriers which retain the packages in a finger-force releasable relationship rather than a locking relationship to avoid damage to the carrier and ceramic body of the packages during the releasing operation.

SUMMARY

Briefly, the invention is directed to integrated circuit carriers and more particularly to such carriers in which retention means are provided with deflection means laterally deflectable by insertion of the body of the integrated circuit package and including finger-force releasable holding means arranged for engagement with side surfaces of the body.

More specifically, the carrier is adapted to receive an inserted integrated circuit package which preferably is of the dual-in-line type having leads and a generally flat rigid body of ceramic construction with relatively thin side surfaces. The carrier is formed to include an insulating housing perferably of one-piece construction.

A cavity is provided in the housing and extends rearwardly from a front face into the housing and is sized to receive the integrated circuit package. Pairs of opposite rearwardly extending walls define the cavity.

Retention means are provided which include deflection means disposed on at least one of the walls and extending rearwardly therefrom in spaced-apart relationship so as to be deflectable towards the wall by insertion of the body. The deflection means includes a surface facing away from the wall towards the body which extends rearwardly, preferably at an acute angle to the wall, and including finger-force releasable holding means arranged to retain the body in the desired position. In the preferred embodiment, the holding means includes one or more detents in which at least one detent bears against a side surface of the body, preferably at an upper edge to restrain frontward movement of the package while permitting release by the application of moderate force as can be applied by a finger acting on the rearward surface of the body in a frontward direction.

The above features of the invention are further enhanced by the incorporation of supporting surfaces as a rearward stop for the package, guide surfaces which laterally position the package in the carrier, and by a one-piece construction in which these features are provided.

One of the advantages of the carrier of the invention is that dual-in-line packages can be retained without dependence on their leads. Another advantage is that the body can serve for the retention which thereby permits the carrier to accommodate packages with leads in various arrangements. A further advantage is that deflection means are provided which retain the packages while permitting its easy release by the application of finger force. Yet another advantage is a carrier of one-piece construction in which the package can be guided to a predetermined rearward position and releasably retained in that position. An additional advantage is that the deflection means includes holding means to accommodate bodies of differing thicknesses while still permitting their easy release.

DETAILED DESCRIPTION

Figures 1, 2, 3, 4, 5, 6:
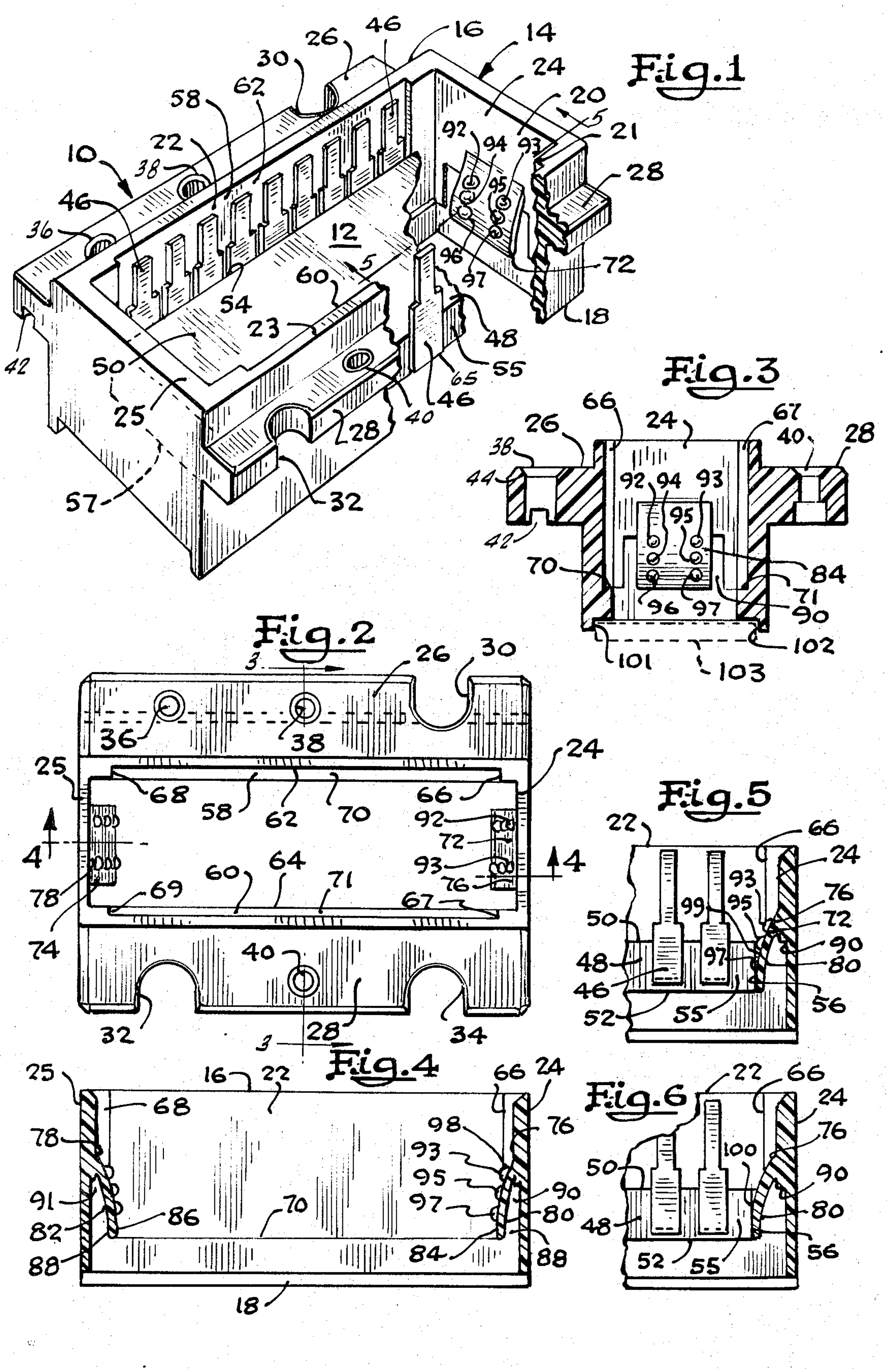
FIG. 1 is top perspective view of one embodiment of the carrier of the invention showing a dual-in-line integrated circuit package retained therein with both the carrier and package being partially cut away to expose particular features.
FIG. 2 is a top view of the carrier of FIG. 1 without the integrated circuit package.
FIG. 3 is a sectional view of the carrier of FIG. 2 taken along line 3—3.
FIG. 4 is a sectional view of the carrier of FIG. 2 taken along line 4—4.
FIG. 5 is a fragmentary sectional view of the carrier and package of FIG. 1 taken along line 5—5.
FIG. 6 is a fragmentary sectional view similar to FIG. 5 and showing another embodiment of the invention.

Referring now in detail to FIGS. 1–6, and initially to

FIG. 1, reference 10 represents an integrated circuit carrier with dual-in-line integrated circuit package 12 positioned therein. As illustrated, carrier 10 includes a one-piece insulating housing 14 formed in a box-like structure with front face 16, rear face 18 and cavity 20 extending therebetween. Cavity 20 is sized to receive package 12 and includes a generally rectangular cross section 21 formed by two opposite pairs of walls 22–23 and 24–25 respectively, which extend rearwardly between faces 16 and 18. By way of example and not limitation, the interior dimensions of the cavity 20 for an eighteen-lead integrated circuit package could be in the order of 0.320 inch by 0.940 inch. The outside dimensions of the housing 14 could be in the order of 0.750 inch by 1.000 inch.

Extending laterally outward from walls 22–23 are peripheral flanges 26 and 28 designed to provide a means whereby carrier 10 can be manually manipulated by automatic handling equipment known in the art. For this purpose notches 30, 32 and 34; and holes 36, 38 and 40 (FIG. 2) are provided together with polarization slot 42 in hole 38 (FIG. 3). Representative hole 38 also includes guide chamfer 44.

The above features as well as their function are known in the art and further detailed description is not required. Also, as with conventional products, carrier 10 is molded of a thermoplastic material capable of withstanding temperatures from −65°C to 155°C during continuous operation. Suitably, the plastic is a polysulfone although other types of thermoplastic or even thermosetting materials could be used.

As illustrated in FIG. 1, package 12 is positioned in carrier 10 and is of the type having dual-in-line leads 46 extending generally perpendicularly from body 48 which is of a generally flat rigid construction. Body 48 is provided with major surfaces 50 and 52 protecting or carrying circuitry of package 12 and rearwardly extending side surfaces 54–57 (FIGS. 1 and 5). Although package 12 is illustrated with 9 leads on each of opposite sides 54 and 55, it is understood that package 12 may include more or less leads as desired. By way of example and not limitation, the body 48 of package 12 could be in the order of about 0.290 inch by 0.880 inch for major surfaces 50 and 52 and 0.060 inch for the thickness of side surface 54. To illustrate variations in surface 54 for different packages, the thickness can commonly be 0.040–0.150 inches.

Walls 22 and 23 of carrier 10 are formed with frontwardly disposed slots 58 and 60 which provide frontwardly disposed surfaces 62 and 64 for loose fitting or spaced relationship with leads 46 of inserted package 12. In representative slot 58, the slot is formed so as to provide opposite guide shoulders 66 and 68 and rearwardly disposed, frontwardly facing support shoulder 70. During the insertion of package 12, guide shoulders 66 and 68 laterally restrict movement of leads 46 of package 12 in cavity 20 although permitting the desired rearward movement until the rear shoulders 65 of leads 46 engage support shoulder 70 which serves as a rearward stop. When inserted, leads 46 of package 12 frontwardly extend in spaced relationship with surfaces 62 and 64. In a similar manner to slot 58, slot 60 is provided with guide shoulders 67 and 69 and with support shoulder 71.

In order that package 12 be maintained in position in carrier 10 during shipping, testing and the like, retention means are provided. In accordance with the invention, these retention means include use of deflection means as illustrated by integrally hinged cantilever fingers 72 and 74 which are integrally formed with walls 24 and 25 at frontwardly disposed surfaces 76 and 78 (FIG. 4) and rearwardly extend in a spaced-apart relationship with their respective walls, thereby being arranged for deflection outwardly towards such walls by insertion of package 12. In FIG. 4, cantilever fingers 72 and 74 extend rearwardly in elongated forms 80 and 82 to provide sufficient deflection and include surfaces 84 and 86 facing away from walls 24 and 25 towards body 48. As illustrated (FIGS. 1 and 4–5), both elongated forms 80 and 82 and surfaces 84 and 86 taper inwardly and rearwardly from walls 24 and 25 at an acute angle 88 which advantageously is less than 45° and preferably is in the order of about 5°–15° although with holding means as particularly described below, angle 88 may include 0°. By way of example and not limitation, cantilever fingers 72 and 74 could be separated by a dimension in the order of 0.830 inches with guide shoulders 66 and 68 being separated by 0.860 inches. A representative length of finger 72 is in the order of about 0.140 inch.

In FIGS. 1–6, walls 24–25 are illustrated with rearwardly formed slots 90–91 laterally positioned below fingers 72 and 74 to provide increased deflection thereof. As illustrated in FIG. 3, slot 90 is wider than finger 72 as is slot 91 with respect to finger 74.

In FIG. 3, representative surface 84 includes holding means as illustrated by detents 92–97 to insure adequate retention of body 48 in the desired position. To avoid abutting or locking action with frontwardly disposed major surface 50, detents 92–97 are formed so that engagement at the upper edge 98 of side 56 (FIG. 5) is angular and does not extend over to major surface 50 in abutting or locking engagement. Preferably, detents 92–97 are formed with sloped or inclined surfaces 99 to provide the desired release characteristics upon the application of finger force in a frontward direction on major surface 52 of body 48.

While representative cantilever finger 72 includes six detents 92–97, fewer or greater numbers of detents can be utilized depending on the particular range of thickness of body 48. Particularly when body 48 is of small thickness, cantilever fingers 72 and 74 rearwardly extend at least to a position which is coplanar with support shoulders 70 and 71 to prevent cantilever finger 72 or 74 from sliding over frontwardly disposed package 12 in carrier 10, thereby causing package to be locked in position.

In FIG. 6, another embodiment is illustrated in which cantilever finger 72 acts without the use of detents 92–97 to hold body 48 in position. In this embodiment, surface 84 engages side 56 over area 100 to provide sufficient frictional force for the desired holding action.

As illustrated in FIG. 3, walls 22–23 include rearward notches 101–102 to accommodate lid 103 which in some instances may be positioned rearwardly over carrier 10.

The foregoing description of the present invention is only illustrative of an exemplary form which the invention may take. Still other modifications and variations will suggest themselves to persons skilled in the art. It is intended, therefore, that the foregoing detailed description be considered as exemplary only and that the scope of the invention be ascertained from the following claims.

What is claimed is:

1. A carrier adapted to receive an inserted dual-in-line integrated circuit package having leads and a generally flat rigid body with rearwardly extending side surfaces, said carrier comprising a one-piece insulating housing including a front face, a cavity having a generally rectangular cross-section extending rearwardly from said face and sized to receive said package, a plurality of rearwardly extending walls forming said cavity with frontwardly disposed surfaces for receiving said leads in spaced relationship and rearwardly disposed supporting surfaces for rearwardly positioning said package in said cavities, and retention means for retaining said body in said cavity, said means including deflection means integrally hinged frontwardly on opposite first and second of said walls and rearwardly extending therefrom in elongated form to at least a position coplanar with said supporting surfaces and in spaced-apart relationship so as to be capable of deflection towards said one wall by the insertion of said body, said elongated form including a surface facing away from said one wall at an acute angle, said surface including finger-force releasable holding means arranged to engage one of said side surfaces of said body and including a plurality of rearwardly spaced-apart detents to accommodate bodies of differing rearwardly extending side surfaces.

2. The carrier of claim 1 wherein said walls include frontwardly disposed guide surfaces arranged for predetermined lateral positioning of said package in said cavity.

3. The carrier adapted to receive an inserted dual-in-line integrated circuit package having leads and a generally flat rigid body with rearwardly extending side surfaces, said carrier comprising an insulating housing including a front face, a cavity having a generally rectangular cross section extending rearwardly from said face and sized to receive said package, first and second pairs of rearwardly extending opposite walls forming said cavity with said first pair of said walls having frontwardly disposed surfaces for receiving said leads in loose fitting relationship and rearwardly disposed, frontwardly facing surfaces for supporting said package, and retention means for retaining said body in said carrier, said means including deflection means integrally hinged on each of said second pair of opposite walls, each deflection means extending rearwardly from said each wall in elongated form and in spaced-apart relationship for deflection towards said each wall by insertion of said body, said elongated form including a surface facing away from said each wall and including finger-force releasable holding means arranged to engage one of said side surfaces of said body, said holding means including a plurality of rearwardly spaced-apart detents to accommodate bodies of differing rearwardly extending side surfaces.

4. The carrier of claim 3 wherein said cavity extends from said front face rearwardly through said housing, said deflection means is an elongated cantilever finger rearwardly extending away from said wall at an acute angle and said first pair of opposite walls includes guide surfaces arranged for predetermined lateral positioning of said package in said cavity.

5. The carrier of claim 4 wherein said housing includes a pair of peripheral flanges extending laterally and including means for cooperating with carrier handling equipment, and said cantilever finger extends rearwardly to at least a position coplanar with said support rearwardly disposed frontwardly facing surfaces.

* * * * *